(12) United States Patent
Kim et al.

(10) Patent No.: US 7,560,943 B2
(45) Date of Patent: Jul. 14, 2009

(54) ALIGNMENT FEATURES IN A PROBING DEVICE

(75) Inventors: Tae Ma Kim, Livermore, CA (US); Bunsaki Nagai, Tokyo (JP)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/046,362

(22) Filed: Mar. 11, 2008

(65) Prior Publication Data

US 2008/0150566 A1 Jun. 26, 2008

Related U.S. Application Data

(62) Division of application No. 10/411,179, filed on Apr. 10, 2003, now Pat. No. 7,342,402.

(51) Int. Cl.
*G01R 31/02* (2006.01)
(52) U.S. Cl. .................................. 324/754; 324/762
(58) Field of Classification Search ........................ None
See application file for complete search history.

(56) References Cited

U.S. PATENT DOCUMENTS

| | | | |
|---|---|---|---|
| 3,696,985 A | 10/1972 | Herring et al. | |
| RE28,798 E | 5/1976 | Herring et al. | |
| 4,677,474 A | 6/1987 | Sato et al. | |
| 4,929,893 A | 5/1990 | Sato et al. | |
| 5,091,692 A | 2/1992 | Ohno et al. | |
| 5,105,149 A | 4/1992 | Tokura | |
| 5,321,352 A | 6/1994 | Takebuchi | |
| 5,347,363 A | 9/1994 | Yamanaka | |
| 5,481,202 A | 1/1996 | Frye, Jr. | |
| 5,585,738 A * | 12/1996 | Kuji et al. | 324/754 |
| 5,705,814 A | 1/1998 | Young et al. | |
| 6,208,375 B1 | 3/2001 | Kay et al. | |
| 6,249,135 B1 | 6/2001 | Maruyama et al. | |
| 6,359,455 B1 * | 3/2002 | Takekoshi | 324/754 |
| 6,426,638 B1 * | 7/2002 | Di Stefano | 324/754 |
| 6,441,315 B1 * | 8/2002 | Eldridge et al. | 174/260 |
| 6,507,204 B1 * | 1/2003 | Kanamaru et al. | 324/754 |
| 6,515,494 B1 | 2/2003 | Low | |
| 6,774,652 B2 | 8/2004 | Isa | |
| 6,856,152 B2 | 2/2005 | Hidehira | |
| 6,922,069 B2 * | 7/2005 | Jun | 324/762 |
| 6,933,738 B2 | 8/2005 | Martin et al. | |
| 7,034,854 B2 * | 4/2006 | Cruchon-Dupeyrat et al. | 346/140.1 |
| 7,342,402 B2 | 3/2008 | Kim et al. | |
| 7,463,043 B2 * | 12/2008 | Cooper et al. | 324/754 |
| 2003/0013340 A1 * | 1/2003 | Martin et al. | 439/488 |
| 2006/0066334 A1 | 3/2006 | Martin et al. | |

FOREIGN PATENT DOCUMENTS

JP 2001-349929 12/2001

* cited by examiner

*Primary Examiner*—Paresh Patel
(74) *Attorney, Agent, or Firm*—N. Kenneth Burraston

(57) ABSTRACT

An image of an array of probes is searched for alignment features. The alignment features are then used to bring contact targets and the probes into contact with one another. The alignment features may be a feature of one or more of the tips of the probes. For example, such a feature may be a corner of one of the tips. An array of probes may be formed to have such alignment features.

11 Claims, 12 Drawing Sheets

ALIGNMENT FEATURES IN A PROBING DEVICE

FIELD OF THE INVENTION

This invention relates generally to probing a device.

BACKGROUND

Although the present invention is generally applicable to probing any device, the present invention is particularly suited for probing an integrated circuit to test the integrated circuit. As is known, integrated circuits are typically manufactured as a plurality of dice on a semiconductor wafer. FIG. 1 illustrates a typical test system 100 for testing a semiconductor wafer 124. The exemplary test system shown in FIG. 1, includes a tester 102, a test head 118, a probe card 106, and a prober 120.

A semiconductor wafer 124 is placed on a chuck (also commonly referred to as a stage) 114, which typically is capable of movement in the "x," "y," and "z" directions. The chuck 114 may also be capable of being rotated and tilted and may be capable of other motions as well. Once the semiconductor wafer 124 is placed on the chuck 114, the chuck is typically moved in the "x," "y" directions so that terminals on the dice (not shown) of the wafer 124 align with probes 108 on the probe card 106. The chuck 114 then typically moves the wafer 124 upward in the "z" direction, bringing the terminals into contact with the probes 108. One or more cameras 121, 122 may aid in aligning the terminals and the probes and determining contact between the probes 108 and the terminals.

Once the terminals of the dice (not shown) are in contact with the probes 108, a tester 102, which may be a computer, generates test data. The test data is communicated through one or more communication links 104 to a test head 118. The test data is communicated from the test head 118 through interconnections 116 (e.g., pogo pins) to the probe card 106 and finally to the terminals of the dice (not shown) through probes 108. Response data generated by the dice are communicated in reverse direction from the probes 108, through the probe card 106, through interconnections 116, through the probe head 118, through a communication link 104, to the tester 102.

Typically, the terminals on the dice and the probes 108 are relatively small. Regardless of the size of the terminals and probes, however, improved methods and techniques for aligning the terminals and the probes are needed.

SUMMARY OF THE INVENTION

This invention relates generally to probing a device. An image of probes is searched for alignment features. The alignment features are then used to bring contact targets and the probes into contact with one another. The alignment features may be a feature of one or more of the tips of the probes. For example, such a feature may be a corner of one of the tips.

DETAILED DESCRIPTION OF EXEMPLARY EMBODIMENTS OF THE INVENTION

The present invention relates generally to probing a device. This specification describes exemplary embodiments and applications of the invention. The invention, however, is not limited to these exemplary embodiments and applications or to the manner in which the exemplary embodiments and applications operate or are described herein.

Figure 1:
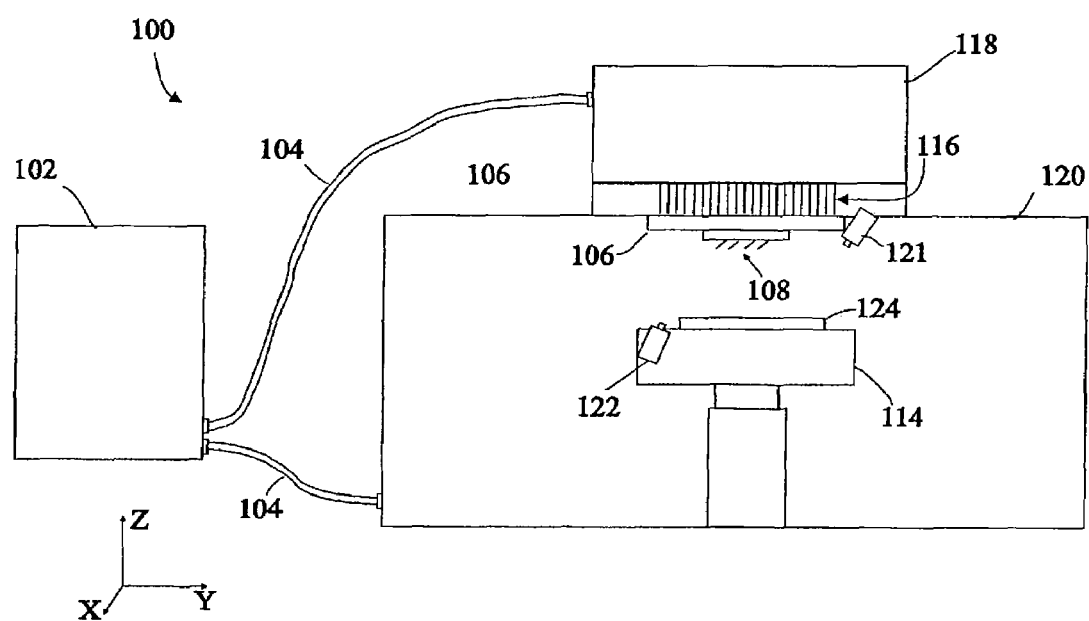
FIG. 1 illustrates an exemplary prior art semiconductor test system.
Figure 2:
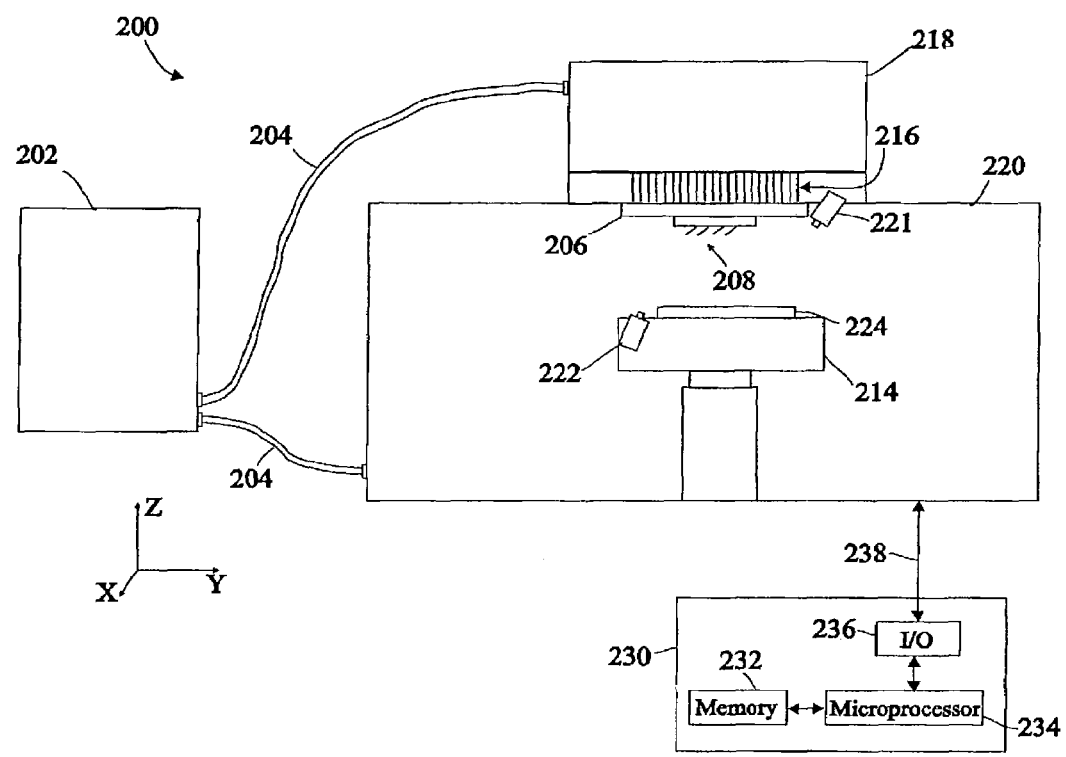
FIG. 2 illustrates an exemplary test system.

FIG. 2 illustrates an exemplary semiconductor test system 200, which in some respects may be generally similar to the test system 100 shown in FIG. 1. That is, exemplary test system 200 includes a tester 202, one or more communication links 204, a prober 220, a test head 218, a probe card 206, and interconnections 216 between the probe card and the test head, all of which may be in some instances generally similar to like elements as described above with respect to FIG. 1. For convenience purposes (and not by way of limitation), directions in FIG. 2 are identified using an "x," "y," and "z" coordinate system in which the "z" direction is the vertical (up or down) with respect to FIG. 2, the "x" direction is horizontally into or out of the page in FIG. 2, and the "y" direction is also horizontal but to the right or left in FIG. 2.

As shown in FIG. 2, the test system 200 also includes a microprocessor-based controller 230. As shown, controller 230 includes a digital memory 232, a microprocessor 234, input/output electronics 236, and input/output port 238. The digital memory 232 may be any type of memory including an electronic memory, an optical memory, a magnetic memory, or some combination of the foregoing. As just two examples, digital memory 232 may be a read only memory, or digital memory 232 may be a combination of a magnetic or optical disk and a random access memory. Microprocessor 234 executes instructions or "software" stored in digital memory 232, and input/output electronics 236 controls input and output of electrical signals into and out of controller 230. (As used herein, the term "software" is intended to include any type of machine executable instructions including without limitation microcode and firmware.) Input data and signals are received and output data and signals are output via port 238. Various data may be input via port 238 to controller 230. For example, such data may include data indicating the position or current movement status of chuck 214, images of the probes 208 and/or wafer 224, etc. Among other things, control signals for controlling movement of the chuck assembly 214 may be output via port 238 by controller 230.

Cameras 221 and 222 may, among other things, provide images of the probes 208 and the wafer 224. As will be seen, those images may be used to align terminals (not shown) on the wafer 224 with the probes 208. As will also be seen, software operating on controller 230 may, among other things, search an image of probes 208 for alignment features and move the chuck 214 so that terminals (not shown) on the wafer 224 are brought into contact with the probes 208.

Figure 3A:
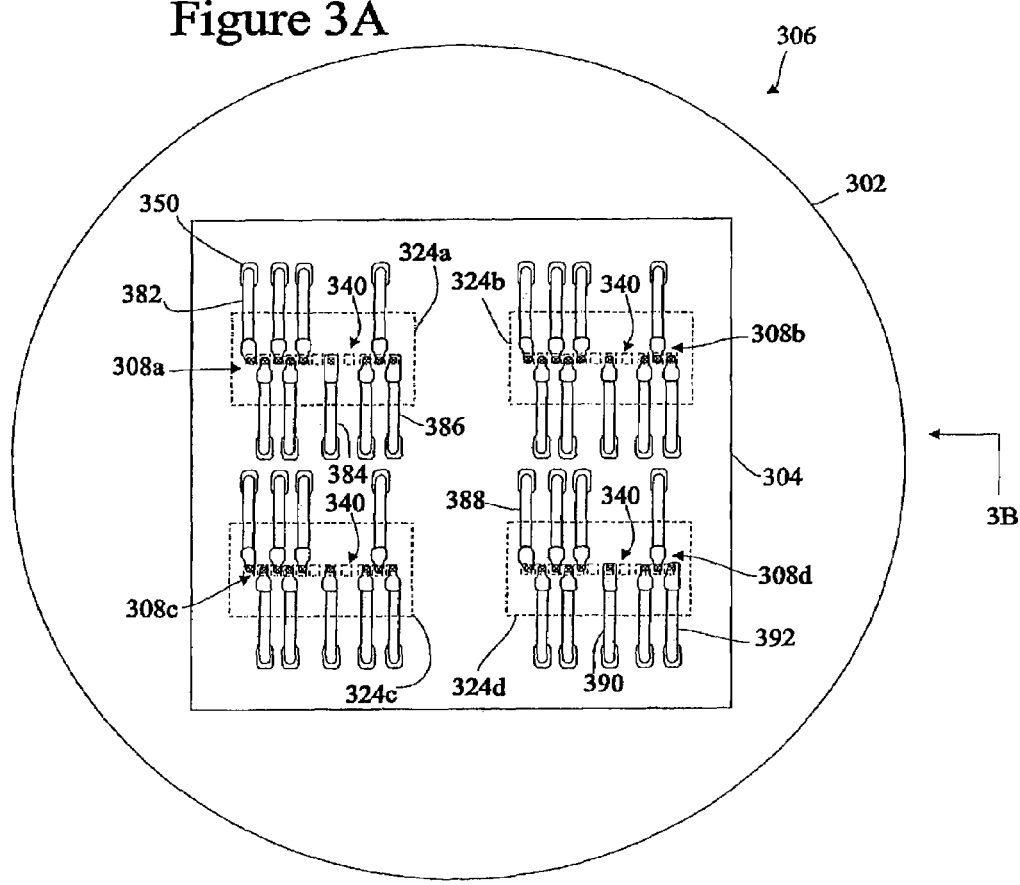
FIGS. 3A and 3B illustrate an exemplary probe card.
Figure 3B:
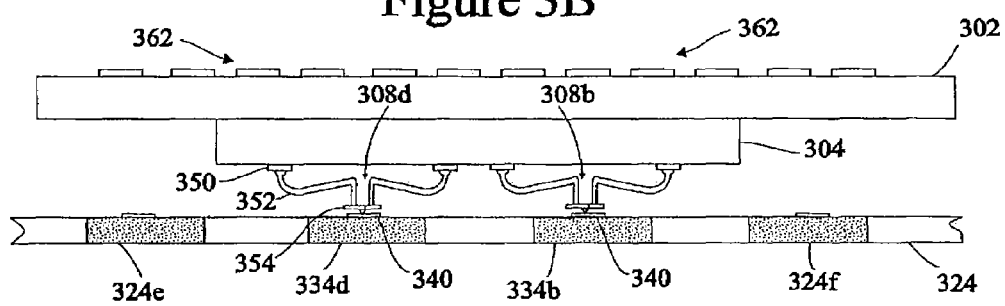

FIGS. 3A and 3B illustrate an exemplary probe card 306 that may be used in test system 200. FIG. 3A shows a bottom view of the probe card 306, and FIG. 3B shows a side view. FIG. 3B also shows a partial-side view of a wafer 324 being contacted by the probes of probe card 306. As will be seen, probe card 306 includes alignment features configured to be reliably discernable in an image of the probes.

The exemplary probe card 306 includes a board substrate 302 (e.g., a printed circuit board) and a probe head 304 (e.g., a ceramic substrate). The board substrate 302 includes contacts 362 for contacting interconnections 216 to test head 218 (see FIG. 2). Probes, each of which includes body portion 352 and a contact structure 354, are attached to contacts 350 on the probe head 304. Internal and/or external electrical connections (not shown) connect ones of contacts 362 with ones of contacts 350. Of course, the probe card 306 shown in FIGS. 3A and 3B is exemplary only. Any type of probing contactor may be used, including without limitation a probe card assembly such as illustrated in U.S. Pat. No. 5,974,662, which is incorporated by reference herein in its entirety.

The exemplary probe card 306 shown in FIGS. 3A and 3B is configured to contact four dice, each having eleven terminals in a lead-on-center configuration. The probe card 306 thus has four sets of probes 308a, 308b, 308c, 308d, each set for contacting one of the dice. (The locations of the four dice 324a, 324b, 324c, 324d relative to the probes and locations of the eleven terminals 340 on each of the dice are shown in dashed lines in FIG. 3A.) Note, however, that each set of probes includes only nine probes. In some instances, it is not necessary to contact all of the terminals of a die to test the die, and this is assumed to be the case in this example. Thus, for purposes of this example, it is assumed that only nine of the eleven terminals 340 need to be probed to test a die 324. Of course, the number of dice contacted at one time as well as the configuration of the terminals, the total number of terminals, and the number of terminals actually contacted by probes on each die is exemplary only. Any number of dice may be contacted at one time (including only one die or even less than one die); the number and configuration of terminals on each die may vary; and the number of terminals per die that are actually contacted may vary.

Because there are typically many more than four dice on a wafer, the probe card 306 shown in FIG. 3A will test four dice, be repositioned to contact and test four other dice, be repositioned again to contact and test four other dice, etc. until all of the dice on the wafer have been tested. Dice 324e and 324f shown in FIG. 3B are other such dice that either already have been tested or will subsequently be tested. It should be noted that probe cards are available that are capable of testing many more than four dice at a time. Indeed, a probe card may have enough probes to contact and test all dice on a wafer at once. Four dice are shown in FIG. 3A to simplify the illustration.

As will be seen, three probes in probe set 308a (probes 382, 384, 386) and three probes in probe set 308d (probes 388, 390, 392) include exemplary alignment features configured to be discernible in an image of the probes. As will also be seen, the exemplary alignment feature on each of probes 382 and 388 is one corner of the contact tip on the probe, the exemplary alignment feature on each of probes 384 and 390 is four corners of the contact tip, and the exemplary alignment feature on each of probes 386 and 392 is two corners of the contact tip. Of course, the number of probe sets selected to have alignment features and the number of alignment features in each probe set is exemplary only. Three probes are selected in sets 308a and 308d of FIG. 3A for illustration purposes only.

Figure 4A:
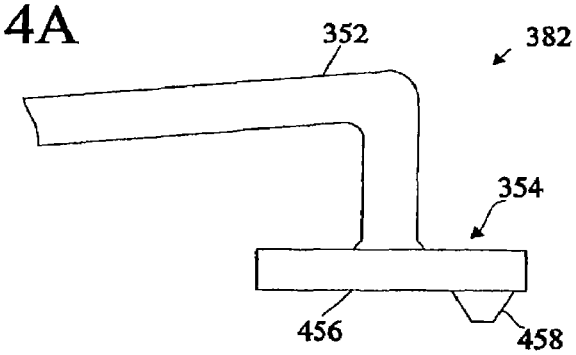
FIG. 4A illustrate a partial, side view of probe 382 in FIG. 3A.
Figure 4B:
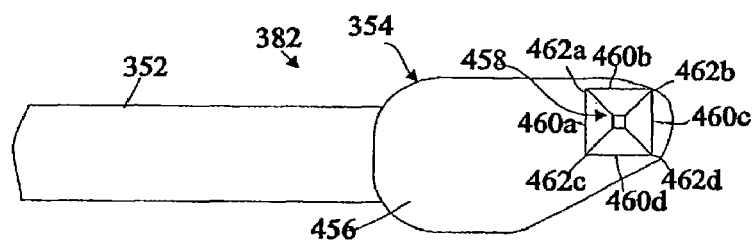
FIG. 4B illustrate a partial, bottom view of probe 382 in FIG. 3A.

FIGS. 4A and 4B shown partial side and partial bottom views, respectively, of exemplary probe 382. As shown, probe 382 includes a body portion 352 and a contact structure 354. One end of the body portion 352 is attached to a contact 350 of probe head 304 (see FIG. 3B), and the contact structure 354 is attached to the other end of the body portion 352. The contact structure 354 includes a support 456 and a tip 458. The tip 458 is the part of the probe that makes actual contact with a terminal on the wafer.

Figure 4C:
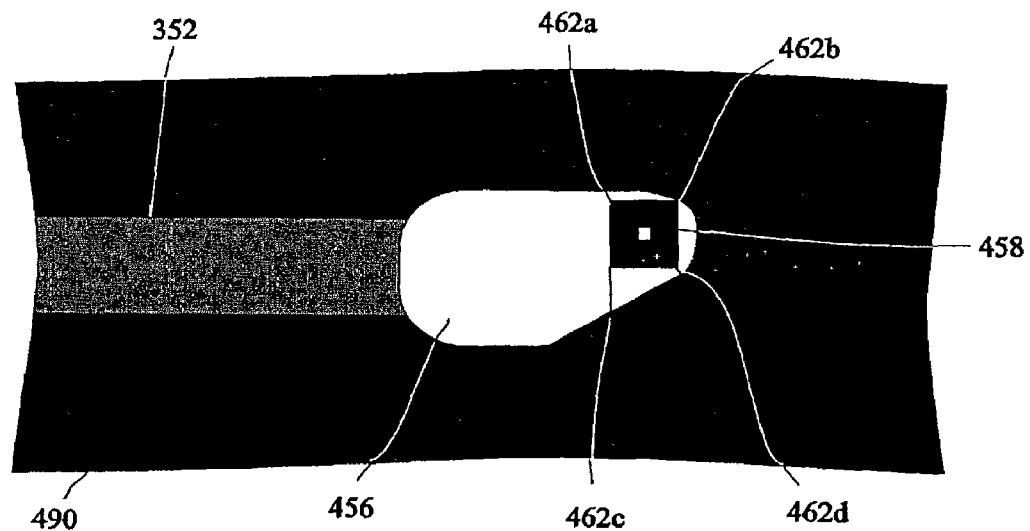
FIG. 4C illustrates an exemplary partial image of probe 382 in FIG. 3A.

The tip 458, which includes four edges 460a, 460b, 460c, 460d and four corners 462a, 462b, 462c, 462d, is disposed on what is preferably a generally planar surface of the support 456. If a camera, such as camera 221 in prober 220 (see FIG. 2), is focused on the support 456, an image of the probe will look generally as shown in FIG. 4C. The support 456 will appear light. Angled surfaces of the tip 458 will appear dark, as will the background surface 490 of the probe head 304. Because the camera 221 is not focused on the probe body 352, it too will appear generally dark or at least darker than the support 456.

Many imaging processing algorithms are known for finding a particular feature in an image, and such algorithms typically include design rules specifying minimum spacing requirements that, if followed, create a relatively high probability that the algorithm will find the feature in an image. As will be seen, support 456 is shaped and tip 458 is positioned so that one corner 462c of tip 458 meets the exemplary minimum spacing requirements of a hypothetical image processing algorithm. Such minimum spacing requirements are often referred to as "design rules." The design rules specify minimum spacings for a feature so that the feature stands out in an image with sufficient contrast that the algorithm will reliably find the feature in the image. Put another way, the design rules are intended to ensure that a feature to be found in an image is sufficiently surrounded by a differently colored background such that an image processing algorithm can reliably find the feature in the image. A feature formed in accordance with the design rules of an image search algorithm may be said to be "visible" in an image that includes the feature.

Figure 4D:
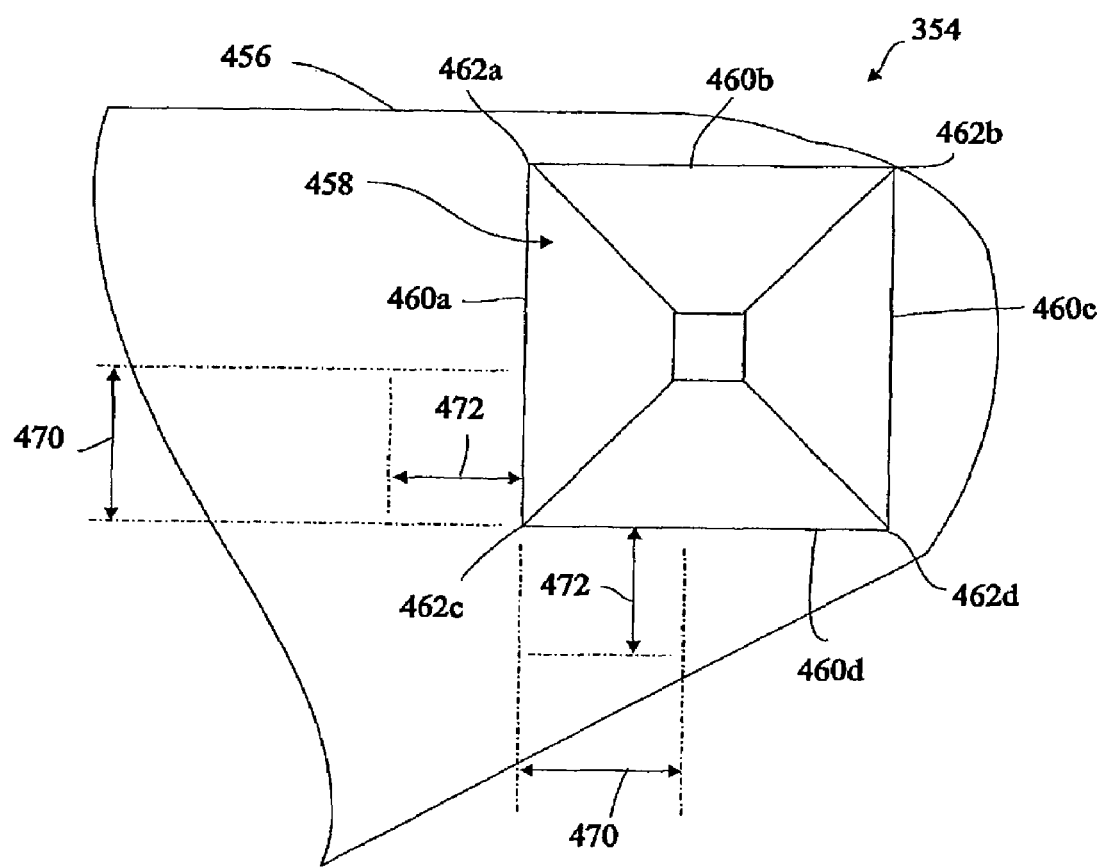
FIG. 4D illustrates a partial, bottom view of contact structure 354 in FIGS. 4A and 4B.

FIG. 4D, which shows a partial view of support 456 and tip 458 of probe 382, illustrates an exemplary design rule for ensuring that one corner (in this case corner 462c) can be found by a hypothetical image search algorithm in an image of probe 382, such as the image shown in FIG. 4C. Per the exemplary design rule illustrated in FIG. 4D, a corner is "visible" if the edges that form the corner are spaced a minimum distance 472 from the outer perimeter of support 456 along a minimum length 470 of the edges. As can be seen in FIG. 4D, two edges 460a and 460d form corner 462c. Although the entire length of edge 460d is not spaced a distance 472 from an outer perimeter of support 456, a length of edge 460d equal to or greater than length 470 is spaced a distance 472 from the perimeter of support 456. As can also be seen, edge 460a easily meets the above-described design rule.

As can be seen corners 462a, 462b, and 462d do not meet the above-described design rules. That is, the edges that form each of those corners are not spaced for a length 470 from the corner a minimum distance 472 from the perimeter of support 456. It should be noted that corners 462a and 462d are space from the perimeter of support 456 and thus may appear as distinct corner shapes in the image shown in FIG. 4C. There is, however, too little of the light colored support 456 surrounding those corners to be sure that the hypothetical image searching algorithm will reliably find the corners, at least in this example.

Specific distances and lengths for 470 and 472 will depend on the actual image processing algorithm used. As just one example, a distance of 10 micrometers or greater for spacing 472 and a length of 10 micrometers or greater for length 470 are believed to be sufficient for many known image processing algorithms. As another example, length 470 may be ⅓ the length of an edge, and the length of an edge may be about 50 micrometers. Such distances and lengths are exemplary only, however; smaller distances and lengths may be sufficient for particular image processing algorithms.

Figure 5:
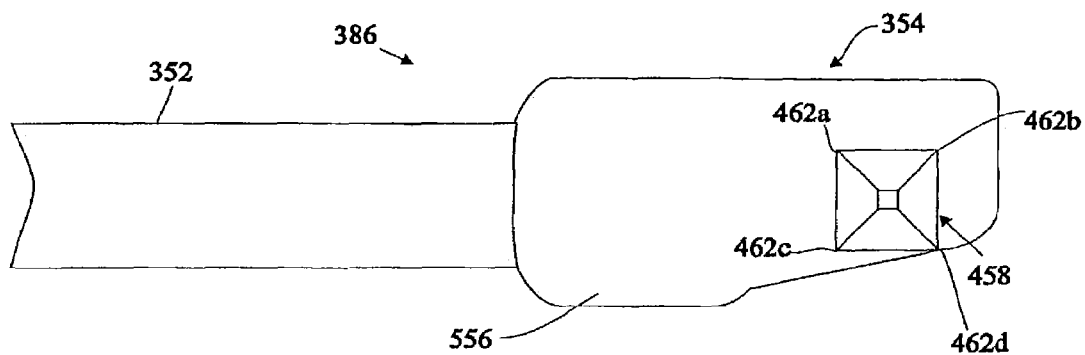
FIG. 5 illustrates a partial, bottom view of probe 386 in FIG. 3A.

FIG. 5 illustrates a partial bottom view of exemplary probe 386 (see FIG. 3A). Exemplary probe 386 is generally similar to probe 382 shown in FIGS. 4A and 4B, except support 556 is shaped and tip 458 is positioned so that the above-described exemplary design rules are met for two corners of the tip, namely corners 462a and 462b. Thus, two corners 462a and 462b can reliably be found by the hypothetical image processing algorithm.

Figure 6:
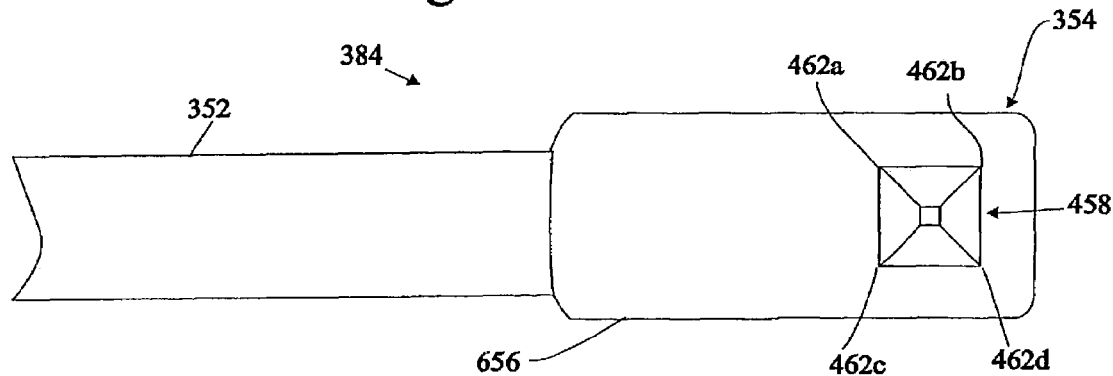
FIG. 6 illustrates a partial, bottom view of probe 384 in FIG. 3A.

FIG. 6 illustrates a partial bottom view of exemplary probe 384 (see FIG. 3A). Exemplary probe 384 is generally similar to probes 382 and 386 shown in FIGS. 4A, 4B, and 5, except support 656 is shaped and tip 458 is positioned so that the above-described exemplary design rules are met for all four corners 462a, 462b, 462c, 462d of the tip. Thus, all four corners 462a, 462b, 462c, and 462d can reliably be found by the hypothetical image processing algorithm.

Figure 7:
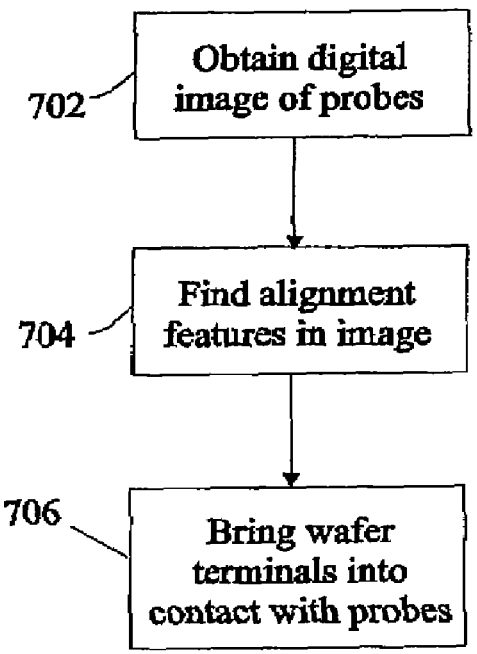
FIG. 7 illustrates an exemplary process showing an exemplary use of alignment features on probes.

FIG. 7 illustrates an exemplary process in which alignment features, such as the exemplary alignment features shown in FIGS. 4A-6, are utilized to bring terminals of a semiconductor wafer into contact with probes of a probe card. The process may be carried out in a test system like test system 200 and implemented in whole or in part by software in a microprocessor-based controller such as controller 230 (see FIG. 2).

Figure 8:
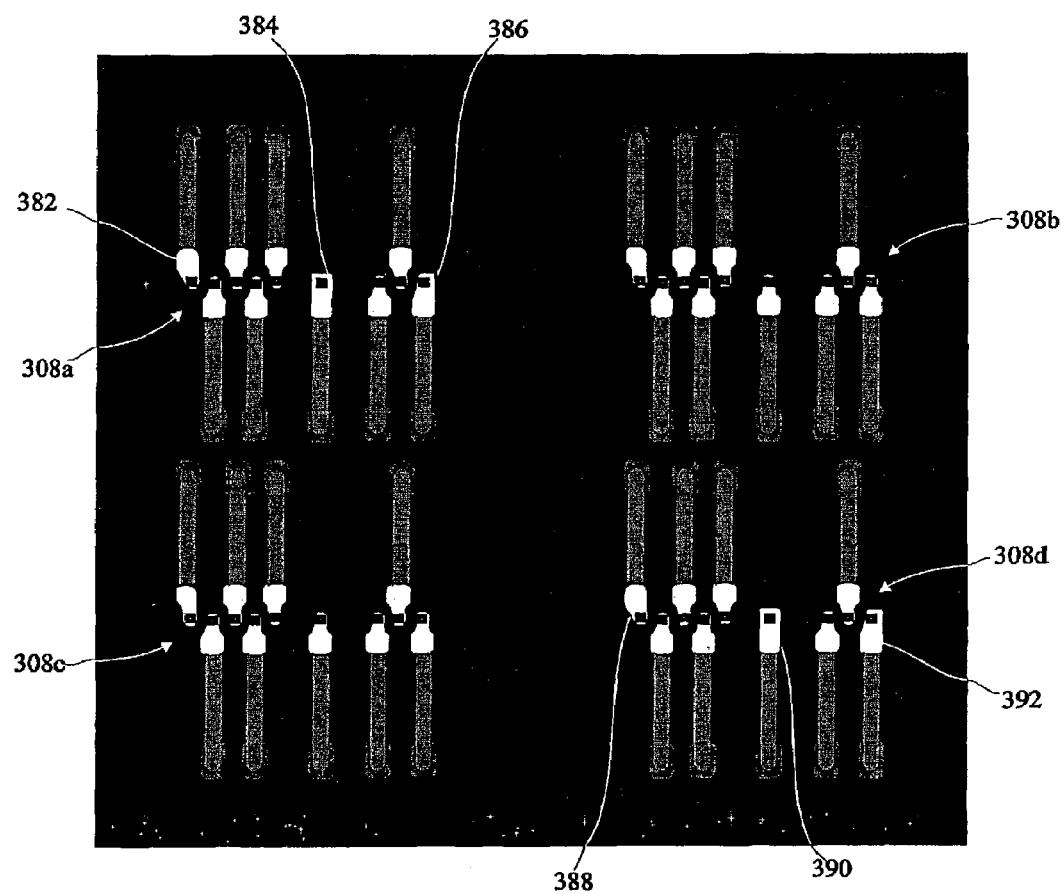
FIG. 8 illustrates an image of the probe array of FIG. 3A.

As shown, FIG. 7 begins with obtaining a digital image (or images) of the probes at step 702. Equipment and processes for capturing and digitizing an image are well known and need not be described here. For example, one or more cameras, such as camera 222, in prober 220 may create an image of the probes 208 of probe card 206. That image may be received by controller 230 via port 238. FIG. 8 illustrates an exemplary image of the probes of probe card 306 (FIG. 3A) captured by camera 222.

Referring again to FIG. 7, the image of the probes is then searched for one or more alignment features at step 704. Again, equipment and processes for searching an image for particular features are known, and any such equipment and process may be used. For example, computer algorithms are known for finding a corner in an image. Such an algorithm may search for a corner in the image by looking for two edges that converge to form generally a right angle. Such an algorithm may identify an edge by looking for a contiguous portion of the image in which there is a generally uniform and abrupt change from one color to another color (where "color" includes, but is not limited to, black and white in a purely binary image and various shades of gray in a purely gray scale image).

As mentioned above, step 704 may be implemented with a software-based image processing algorithm designed to find corners in an image operating in controller 230. (Such image processing algorithms are known and need not be described here.) Typically, the number and type of features expected in the image is programmed into the algorithm. As discussed above, probes 382 and 388 in FIG. 3A were configured such that one corner of their tips is "visible"; probes 384 and 390 were configured such that all four corners of their tips are "visible"; and probes 386 and 392 were configured such that two of the corners of their tips are "visible." Thus, an image search algorithm operating on controller 230 might be programmed to find two sets of four corners, each forming a square or rectangle (each set corresponding to one of probes 384 or 390), two sets of two corners connected by a line segment (each set corresponding to one of probes 386 or 392), and two isolated corners (each corresponding to one of probes 382 or 388).

It should be noted, however, that it may be advantageous to program the algorithm to search only for corners (rather than multiple corners disposed in a particular configuration, such as four corners of a square or rectangle). This is because debris may build up on the tips of the probes of a probe card, and such debris may obscure a corner of a tip. Thus, it may be advantageous for the image search algorithm to search for one corner even if multiple corners of a tip are configured to meet the design rules of the algorithm and thus be reliably "visible" to the algorithm. For example, probes are often designed to wipe across the terminals of the wafer. The wiping action can cause debris to build up on one side of the tips of the probes. Thus, it may be advantageous to configure the tips of such probes such that a corner located away from where the debris is likely to build up (e.g., a corner on the tip opposite the direction of the wiping action) meets the design rules of the image search algorithm.

The step of finding the alignment features in the image (step 704) may also include determining a physical location of the points on the probes that actually contact the terminals on the wafer. Data indicating the physical location of the contact points from the alignment features may be digitally stored, for example in controller 230, and utilized to make such calculations. For example, the actual point of contact with the terminals for the exemplary probe 382 illustrated in FIGS. 4A and 4B is the truncated end of tip 458. Vector data indicating that the actual contact point is a specified distance in a specified direction way from the corner may be stored in controller 230 and utilized by the controller to calculate the locations of the truncated ends of tips 458 with respect to the corners found. The position of the truncated ends of the tips 458 thus can be calculated even if they are obscured by, for example, debris build up.

Still referring to FIG. 7, the next step 706 is to bring terminals of the wafer 224 (or 324) into contact with the probes 208 (or 308a, 308b, 308c, 308d). Equipment and methods for determining the positions of terminals on a wafer are known, and any such equipment and method may be used. An example of such a known method is to create an image of all or part of the wafer 224 (or 324) using camera 221. Image processing software may then be used to find alignment features on the wafer. In practice natural features of the wafer are often utilized as alignment features. For example, a distinctive shape of a portion of the integrated circuitry may be pre-correlated to positions of the terminals on the wafer, and images of the wafer searched for the distinctive shape. Software operating on controller 230 may receive an image of the wafer (created, for example, by camera 221), search the wafer for the alignment features, and determine the locations of the terminals.

Using the now known positions of the probes (from step 704) and the positions of the terminals, the chuck 214 moves the wafer 224 (or 324) such that the selected wafer terminals are brought into contact with the probes, forming temporary electrical connections. Again, software operating in controller 230 may issue commands to control movement of the chuck 214.

Although not shown in FIG. 7, once, the terminals are in contact with the probes, the wafer dice on which the contacted terminals are located may be tested. Thereafter, if necessary, the wafer may be repositioned such that terminals of different dice on the wafer are brought into contact with the probes and those dice tested. This process of contacting terminals, testing dice, and repositioning the wafer to contact and test other dice may continue until all the dice on the wafer have been tested.

Figure 9:
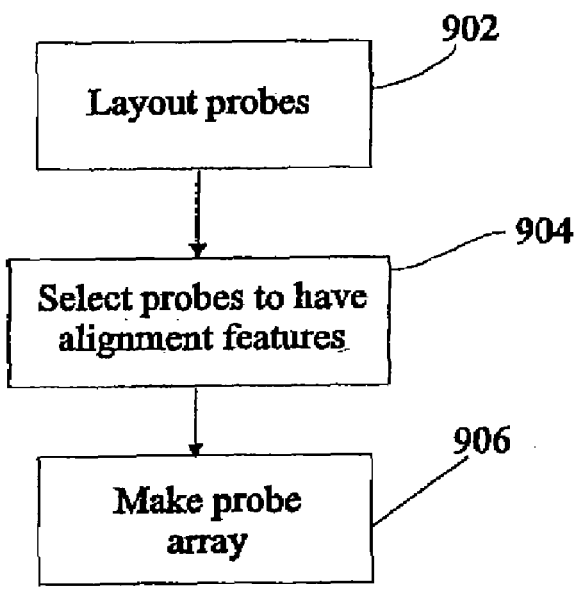
FIG. 9 illustrates an exemplary method for making an exemplary probe array with alignment features.

FIG. 9 illustrates an exemplary method for making a probe array with alignment marks, such as the exemplary probe array shown in FIGS. 3A and 3B. As shown in FIG. 9, the process begins with the step 902 of laying out locations for the probes. Typically, data identifying the number, locations, and signal assignments of terminals on dice to be tested is received, and the probes are laid out such that each probe is attached to a contact 350 on a probe head 304 and oriented such that its contact tip corresponds to a location of a terminal 340 on a die to be tested (see FIG. 3B). Of course, the contact 350 on probe head 304 must be routed to a contact 362 on board substrate 302 that corresponds to the type of signal the die terminal is to receive and/or output (see FIG. 3B).

Referring again to FIG. 9, locations for alignment features in the probe array are determined at step 904. As should be apparent in FIGS. 3A and 8, tips on some adjacent probes in the array may be so close to each other that there is little to no room for an alignment feature that is likely to be distinguishable in a digital image (that is, no room for an alignment feature that meets the design rules of an image searching algorithm to be used). In the exemplary probe layout shown in FIG. 3A, the outer probes 382 and 386 in probe set 308a are selected to have alignment features. Probe 384 is also selected because of the presence of extra space around the probe. Similar selections were made for probe set 308d. In this example, no probes are selected in probe sets 308b or 308c because the six selected probes 382, 384, 386, 388, 390, 392 in probe sets 308a and 308d provide a sufficient number of reference points to properly align the probes 308a, 308b, 308c, 308d with terminals 340.

It should be understood, however, that the number and pattern of probes selected in step 904 to have alignment features illustrated in FIGS. 3A and 8 is exemplary only and selected to illustrate a variety of tip configurations. Any number and/or pattern of tips with distinguishable corners may be used. For example, tips with distinguishable corners may be placed on all of the probes. As another example, tips with distinguishable corners may be placed on only two of the probes on the probe substrate 304. As yet another example, tips with distinguishable corners may be placed on two probes in each probe set 308a, 308b, 308c, 308d. The foregoing exemplary patterns are not exhaustive; the patterns are not critical, and any pattern may be selected.

Similarly, the selection shown in FIGS. 3A and 8 of two probes having one "visible" corners, two probes having two "visible" corners, and two probes having four "visible" corners is exemplary only. In practice, all of the tips configured to function as an alignment mark may be configured to have the same number of "visible" corners. Alternatively, any combination of "visible" corner configurations may be used.

Referring again to FIG. 9, the next step 906 is to fabricate the probe array with the probes laid out as determined in step 902 and with the alignment marks as determined in step 904. FIGS. 10A-12B illustrate a first example of step 906, and FIGS. 13A-15B illustrate a second example.

Turning first to FIGS. 10A-12B, those figures illustrate an example of fabricating an array of probes in which contact structures 1160a, 1160b (each comprising a support 1156 and a tip 1158) are separately fabricated and then attached to probe bodies 1252. For simplicity of illustration, only two probes 1208a, 1208b in the array are shown in FIGS. 10A-12B. As will be seen, one of those probes 1208a will be fabricated with a an alignment mark, which will be one "visible" corner of a tip 1158a; the other probe 1208b will not be fabricated with an alignment mark.

Figure 10A:
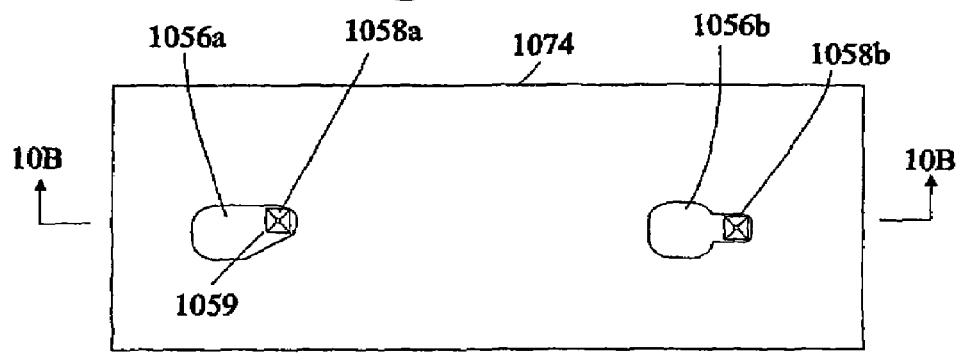
FIGS. 10A through 12B illustrate an example of making a probe array with alignment features.

FIGS. 10A-11B illustrate formation of contact structures 1160a, 1160b on a sacrificial substrate 1072, which may be a silicon wafer, for example. As shown in FIGS. 10A and 10B, molds defining the shapes of the contact structures are made on the sacrificial substrate 1072. In the example shown in FIGS. 10A and 10B, the molds comprise pits 1058a, 1058b and openings 1056a, 1056b. The pits 1058a, 1058b are etched in the sacrificial substrate 1072 and define the tips 1158a, 1158b of the contact structures 1160a, 1160b to be formed. The openings 1056a, 1056b are patterned in a layer of masking material 1074 deposited on the sacrificial substrate 1072. The pits 1058a, 1058b and the openings 1056a, 1056b may be formed in any suitable fashion. For example, the pits may be selectively etched through a mask using a solution such as potassium hydroxide. The masking material 1074 may comprise photo resist.

Figure 10B:
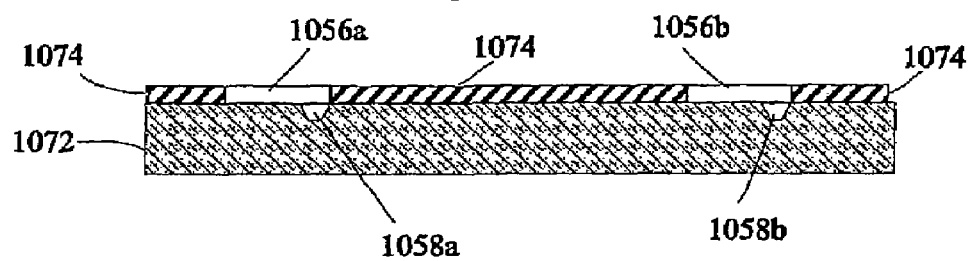

Note that, in the example shown in FIGS. 10A and 10B, opening 1056a is patterned to provide sufficient space around one corner 1059 of pit 1058a such that the corresponding corner of the tip 1158a formed in pit 1058a will be "visible" in an image of probe 1208a. In this example, opening 1056a and pit 1058a are patterned and positioned to be similar to the exemplary support 456 and tip 458 shown in FIGS. 4A and 4B. On the other hand, the opening 1056b is not patterned to provide sufficient space around any of the corners of pit 1058b to make any of the corners of tip 1158b "visible" in an image of probe 1208b.

Figure 11A:
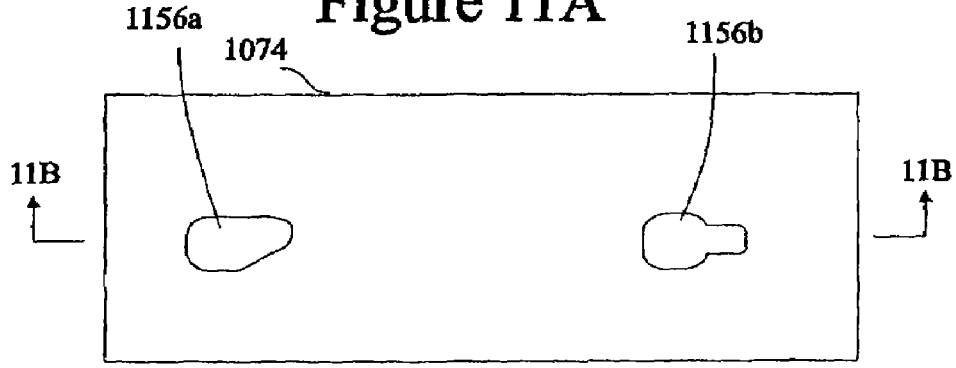
Figure 11B:
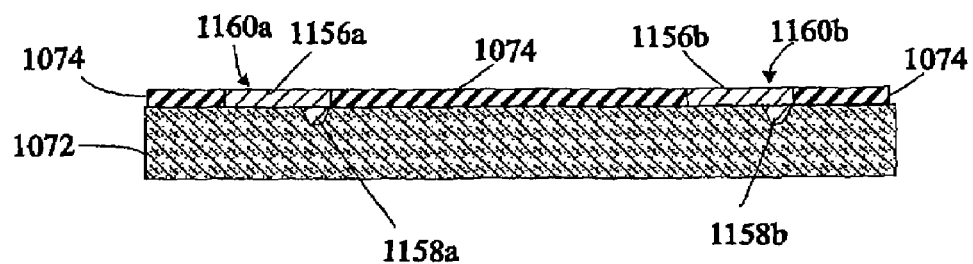

As shown in FIGS. 11A and 11B, one or more materials are then deposited in the pits 1058a, 1058b and openings 1056a, 1056b to form contact structures 1160a, 1160b, each comprising a tip 1158a, 1158b disposed on a support 1156a, 1156b. The material or materials may be any of a number of structural materials including without limitation palladium, gold, rhodium, nickel, cobalt, silver, platinum, conductive nitrides, conductive carbides, tungsten, titanium, molybdenum, rhenium, indium, osmium, copper, and refractory metals; and alloys of any of the foregoing materials, including alloys comprising combinations of one or more of the foregoing materials. Nonlimiting methods of depositing the material or materials include electroplating, chemical vapor deposition, physical vapor deposition, sputter deposition, electroless plating, electron beam deposition, and thermal evaporation.

It should be noted that other layers of material may be applied to the sacrificial substrate 1072 prior to applying the masking layer 1074. For example, a release layer (not shown) to facilitate release of the contact structures 1160a, 1160b from the sacrificial substrate 1072 may be applied; a seed or shorting layer (not shown) may be applied to facilitate electroplating; a material (not shown) may be applied to promote adhesion of the contact structure material. Of course, one layer of material may serve more than one of the forgoing purposes. Also, additional materials may be applied to the contact structures 1160a, 1160b.

Figure 12A:
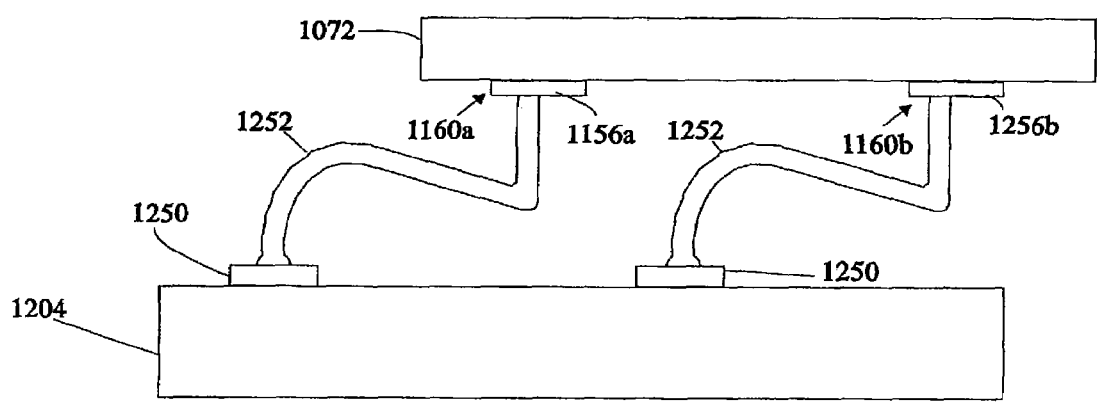
Figure 12B:
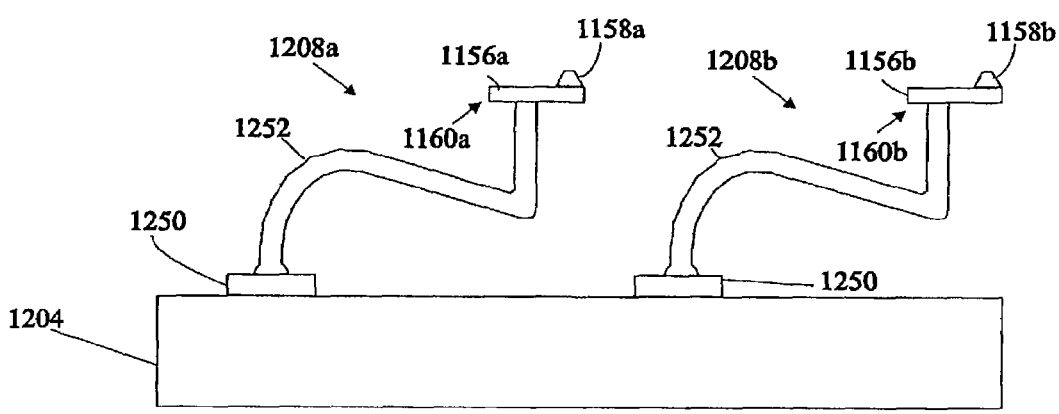

Once contact structures 1160a, 1160b are formed on sacrificial substrate 1072 as shown in FIGS. 11A and 11B, the contact structures 1160a, 1160b are attached to probe bodies 1252, which are themselves attached to contacts 1250 on a probe head 1204. The contact structures 1160a, 1160a may be attached to the probe bodies 1252 using any suitable means, including soldering, brazing, and welding. The exemplary probe bodies 1252 shown in FIG. 12A comprise wires bonded at one end to contacts 1250. (Note that FIG. 12A is not shown in cross-section.) The wires may be made of a soft material and over coated with a harder material as described in any of U.S. Pat. No. 5,476,211, U.S. Pat. No. 5,917,707, U.S. Pat. No. 6,336,269, all of which are incorporated by reference herein in their entirety.

Alternatively, the probe bodies 1252 may be any type of probe, including without limitation needle probes, buckling beams (e.g., "COBRA" probes), bumps, posts, and spring probes. Nonexclusive examples of spring probes that may be used as probe bodies 1252 include, but are not limited to, probes described in U.S. Pat. No. 5,917,707; U.S. Pat. No. 6,268,015; U.S. Pat. No. 6,482,013; U.S. Pat. No. 5,974,662; U.S. Patent Application Publication No. 2001/0001080; U.S. Patent Application Publication No. 2001/0012739; and U.S. patent application Ser. No. 09/953,666, filed Sep. 14, 2001 (pending). All of the foregoing U.S. patents and published and pending patent applications are incorporated by reference herein in their entirety.

Additional examples and further discussion of forming contact structures on a sacrificial substrate and subsequently attaching the contact structures to probe bodies can be found in U.S. Pat. No. 5,974,662, U.S. Pat. No. 6,441,315, and U.S. patent application Ser. No. 09/953,666, filed Sep. 14, 2001 (pending), all of which are incorporated by reference herein in their entirety.

As should be apparent, support 1156a is shaped and tip 1158a is disposed on support 1156a such that one corner of tip 1158a will be "visible" in an image of probe 1208a. Probe 1208a thus includes an alignment mark (i.e., the visible corner) and is generally similar to probes 282 and 288 in FIG. 3A. Probe 1208b, on the other hand, does not include an alignment mark because support 1156b is not shaped and tip 1158b is not disposed on support 1156b such that any of the corners of tip 1158b will be reliably "visible" in an image of probe 1208b. It should be apparent that two, three, or four of the corners of tip 1158a could have been made "visible" by patterning opening 1156a to define a shape for support 1156a and positioning pit 1158a to position tip 1158a on support 1156a such that two corners of tip 1158a are "visible" (e.g., as shown in FIG. 5), three corners of tip 1158a are "visible," or all four corners of tip 1158a are "visible" (e.g., as shown in FIG. 6). Of course, tip 1158b could also have been formed such that one or more corners of tip 1158b are "visible."

Turning next to FIGS. 13A-15B, those figures illustrate an example of fabricating an array of probes in which tips are formed on beams 1456a, 1456b. Again, for simplicity of illustration, only two probes 1508a, 1508b in the array are shown in FIGS. 13A-15B. As will be seen, one of those probes 1508a will be fabricated with an alignment mark, which will be four "visible" corners of a tip 1458a; the other probe 1508b will not be fabricated with an alignment mark.

Figure 13A:
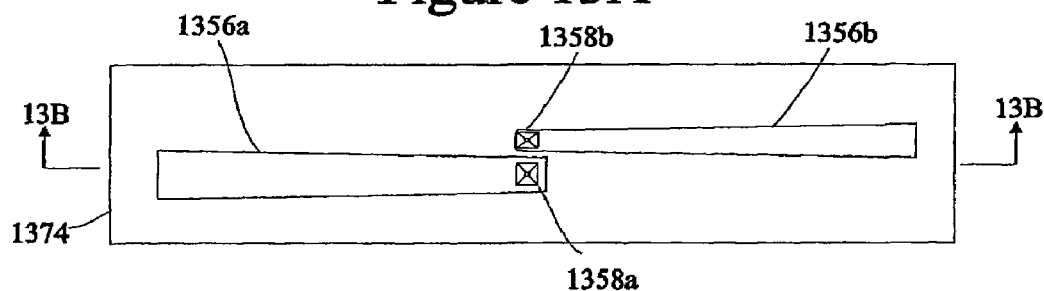
FIGS. 13A through 15B illustrate another example of making a probe array with alignment features.
Figure 13B:
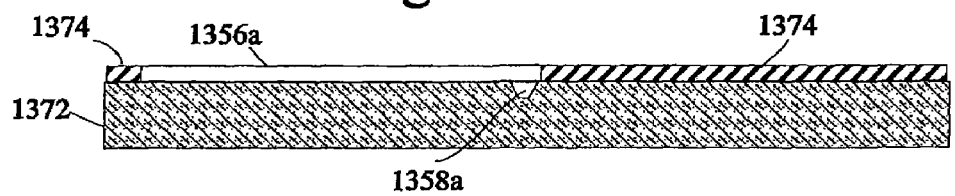
Figure 14A:
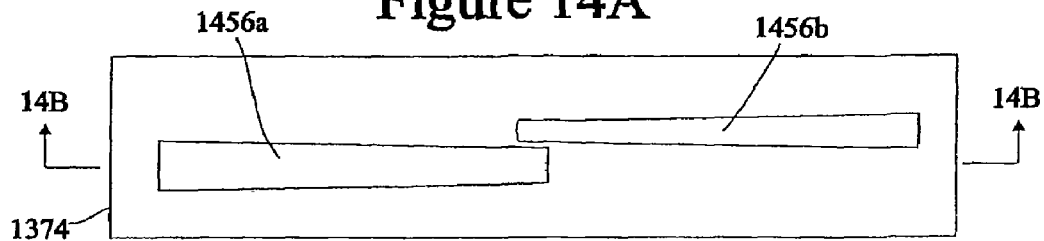
Figure 14B:
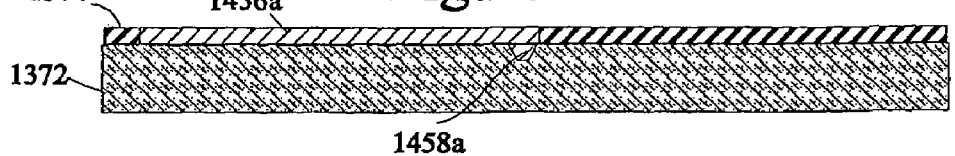

FIGS. 13A-14B illustrate formation of beams 1356a, 1356b on a sacrificial substrate 1372. Generally speaking, the steps and materials illustrated in FIGS. 13A-14B may be generally similar to the steps and materials illustrated and discussed above with respect to FIGS. 10A-12B, except that openings 1356a, 1356b in masking layer 1374 are shaped to form beams. For example, pits 1358a, 1358b may be generally similar to pits 1058a, 1058b, and the material(s) deposited in openings 1356a, 1356b (as shown in FIGS. 14A and 14B) may be generally similar to the material(s) deposited in openings 1056a, 1056b. Also, additional materials (not shown), such as release, seed, and/or adhesion materials, may be deposited on the sacrificial substrate 1372 prior to forming the masking layer 1374 as discussed above with respect to FIGS. 10A-12B.

Note that, in the example shown in FIGS. 13A and 13B, opening 1356a is patterned to provide sufficient space around all four corners of pit 1358a such that the corresponding four corners of the tip 1458a formed in pit 1358a will be "visible" in an image of probe 1508a. In this example, opening 1156a and pit 1058a are patterned and positioned to be, in some respects, similar to the exemplary support 656 and tip 458 shown in FIG. 6. On the other hand, the opening 1356b is not patterned to provide sufficient space around any of the corners of pit 1358b to make the corners of the tip to be formed in pit 1358b reliably "visible" in an image of probe 1508b.

Figure 15A:
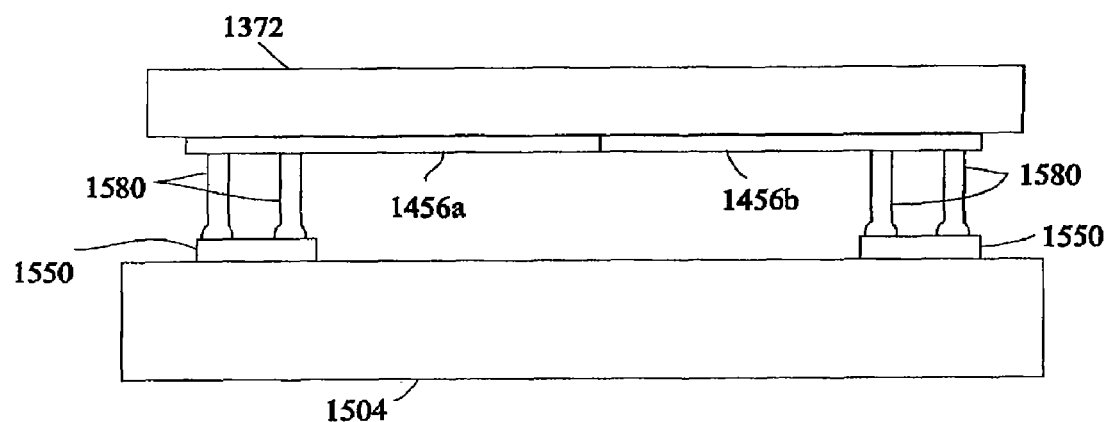

Once beams 1456a, 1456b are formed on sacrificial substrate 1372 as shown in FIGS. 14A and 14B, the beams 1460a, 1460b are attached to post structures 1580, which are themselves attached to contacts 1550 on a probe head 1504. The beams 1456a, 1456b may be attached to the post structures 1580 using any suitable means, including soldering, brazing, and welding. The exemplary post structures 1580 shown in FIGS. 15A and 15B comprise wires bonded at one end to contacts 1550. (Note that FIG. 15A is not shown in cross-section.) The wires may be over coated as described in U.S. Patent Application Publication No. 2001/0012739, which is incorporated in its entirety herein by reference.

Figure 15B:
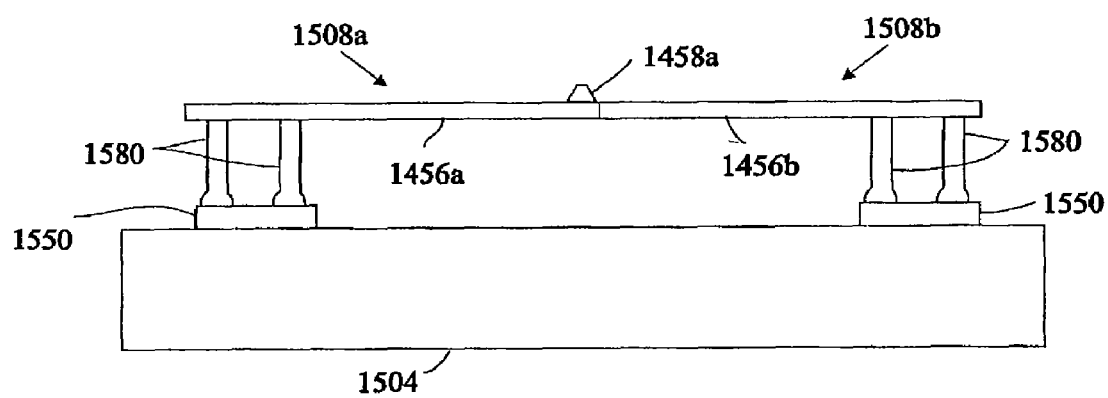

Post structures 1580 need not consist of two structures as shown in FIGS. 15A and 15B but may comprise one structure or more than two structures. Moreover, post structures 1580 need not be wires but may be any type of structure suitable for supporting a beam. For example, post structure 1580 may be a lithographically formed post as described in U.S. Pat. No. 6,268,015. As yet another exemplary variation, post structures 1580, whether wires or other structures, may be formed on or attached to the beams 1456a, 1456b while the beams are still on the sacrificial substrate 1372 (see FIGS. 14A and 14B), after which the posts would be attached to contacts 1550 and the beams released from the sacrificial substrate. Many other variations with regard to the beams are possible. For example, many different shapes and structures of the probes are possible by, for example, shaping the masking layer 1274 and/or utilizing a plurality of masking layers 1274. Examples of the foregoing can be found in U.S. Pat. No. 6,482,013, U.S. Pat. No. 6,184,053, U.S. Pat. No. 6,268,015, U.S. Patent Application Publication No. 2001/0001080, U.S. patent application Ser. No. 09/539,287, filed Mar. 30, 1999 (pending), all of which are incorporated by reference herein in their entirety.

As should be apparent, beam 1456a is shaped and tip 1458a is disposed on beam 1456a such that all four corners of tip 1458a will be "visible" in an image of probe 1508a. Probe 1508a thus includes an alignment mark (i.e., the "visible" corners). Probe 1508b, on the other hand, does not include an alignment mark because beam 1456b is not shaped and its tip (not shown) is not disposed on beam 1456b such that any of the corners of the tip will be "visible" in an image of probe 1508b. It should be apparent that one, two, or three of the corners of tip 1458a could have been made "visible" by patterning opening 1456a to define beam 1456a and positioning pit 1358a to position tip 1458a on beam 1456a such that only one corner of tip 1458a is "visible" (e.g., as shown in FIGS. 4A, 4B, and 4D), two corners of tip 1458a are "visible" (e.g., as shown in FIG. 5), or three corners of the tip 1458a are "visible." Of course, the tip (not shown) on beam 1456b could also have been formed such that one or more corners of its tip are "visible."

It should be noted that the figures are not necessarily to scale. For example, the probes shown in FIGS. 3A and 3B would typically be much smaller compared to the probe head 304 and the board substrate 302. Likewise, the dice 324b, 324d, 324e, and 324f would typically be much closer together on wafer 324 than shown in FIG. 3B. The probes are shown bigger and the dice spaced farther apart in FIGS. 3A and 3B for illustration purposes. Other figures may be similarly not to scale.

Although the principles of the present invention have been illustrated and explained in the context of specific embodiments, it will be appreciated by those having skill in the art that various modifications can be made to the disclosed embodiments without departing from the principles of the invention.

For example, although the foregoing exemplary embodiments show application of the invention to a prober for probing semiconductor wafers, the invention is equally applicable to any testing of an electronic device in which probes are brought into contact with terminals or other contact points or features on the electronic device for the purpose of testing the electronic device. Examples of the foregoing include sockets and test probes for packaged or unpackaged semiconductor devices, including singulated semiconductor dice. Indeed, the invention is applicable to any application in which any type of probes are aligned with contact points or contact features of any type of device.

As yet another example, although FIGS. 10A-15B show formation of at least a portion of the probes on a sacrificial substrate, probes can alternatively be formed in whole or in part directly on the probe substrate 304, 1204, 1504. Examples are described in U.S. Pat. No. 6,268,015, which is incorporated by reference herein in its entirety. As yet another alternative, pieces of the probes can be formed in multiple steps on multiple sacrificial substrates, as described in U.S. Pat. No. 6,520,778, which is incorporated by reference herein in its entirety.

As still another example, although controller 230 is described as microprocessor based and operating under software control, controller 230 may be replaced with a manual controller that is manually manipulated by an operator. For example, an operator might manually search an image and then manually move the chuck 214. Alternatively, controller 230 may operate in part automatically and in part manually. Of course, controller 230 may be replaced with a controller that is not microprocessor based or a controller that is only partially microprocessor based.

Other examples of variations include without limitation utilizing corners of features on the probes other than tips as alignment marks; placing alignment features on dummy probes (that is, probes that are not configured to make contact with a wafer terminal) or on platforms or supports other than probes.

The invention claimed is:

1. A probing apparatus comprising:
   a substrate; and
   a plurality of probes disposed on said substrate, each of said probes comprising a contact tip, said tips disposed in a pattern to contact terminals of semiconductor dies to be tested,
   wherein two or more of first probes of said plurality of probes each comprise a first tip disposed on a first substantially flat surface of said first probe, said first tip disposed on said first substantially flat surface such that a corner of said first tip is disposed at least a predetermined distance from a perimeter of said first substantially flat surface, wherein said predetermined distance is a minimum spacing for a processing algorithm to find said corner of said first tip in a digital image that includes portions of at least some of said probes, and
   one or more of second probes of said plurality of probes each comprising a second tip disposed on a second substantially flat surface of said second probe, said second tip disposed on said second substantially flat surface such that all corners of said second tip are disposed less than said predetermined distance from a perimeter of said second substantially flat surface.

2. The probing apparatus of claim 1, wherein said first tip of each of said first probes is disposed on said first substantially flat surface of said first probe such that a plurality of corners of said first tip are each disposed at least said predetermined distance from said perimeter of said first substantially flat surface.

3. The probing apparatus of claim 2, wherein said predetermined distance is 10 microns.

4. The probing apparatus of claim 2, wherein said first tip of each of said first probes is disposed on said first substantially flat surface of said first probe such that four of said corners of said first tip are each disposed at least said predetermined distance from said perimeter of said first substantially flat surface.

5. The probing apparatus of claim 1, wherein:
   each of said first probes comprises a first body coupled at a first end of said first body to said substrate, said first body extending away from said substrate to a second end of said first body, said first substantially flat surface comprising a first side of a first support structure, a second opposite side of said first support structure coupled to said second end of said first body; and
   each of said second probes comprises a second body coupled at a first end of said second body to said substrate, said second body extending away from said substrate to a second end of said second body, said second substantially flat surface comprising a first side of a second support structure, a second opposite side of said second support structure coupled to said second end of said second body.

6. The probing apparatus of claim 5, wherein said predetermined distance is 10 microns.

7. The probing apparatus of claim 1, wherein said corner of said first tip comprises converging edges of said tip, and at least ⅓ of a length of each of said converging edges from said corner is disposed said predetermined distance from said perimeter of said first substantially flat surface.

8. The probing apparatus of claim 7, wherein said predetermined distance is 10 microns.

9. The probing apparatus of claim 1, wherein said probing apparatus is a probe card assembly for use in a test system for testing dies of a semiconductor wafer.

10. The probing apparatus of claim 9, wherein said predetermined distance is 10 microns.

11. The probing apparatus of claim 1, wherein said predetermined distance is 10 microns.

* * * * *